United States Patent
Inoue

(10) Patent No.: US 8,864,343 B2
(45) Date of Patent: Oct. 21, 2014

(54) LIGHT EMITTING DEVICE

(75) Inventor: Tomohiko Inoue, Himeji (JP)

(73) Assignee: Phoenix Electric Co., Ltd., Hyogo (JP)

(*) Notice: Subject to any disclaimer, the term of this patent is extended or adjusted under 35 U.S.C. 154(b) by 0 days.

(21) Appl. No.: 13/224,885

(22) Filed: Sep. 2, 2011

(65) Prior Publication Data

US 2012/0218765 A1    Aug. 30, 2012

(30) Foreign Application Priority Data

Feb. 24, 2011   (JP) ................. 2011-038824

(51) Int. Cl.
| | |
|---|---|
| G02B 27/09 | (2006.01) |
| F21V 5/04 | (2006.01) |
| G02B 19/00 | (2006.01) |
| F21V 7/04 | (2006.01) |
| F21V 13/04 | (2006.01) |
| F21Y 101/02 | (2006.01) |

(52) U.S. Cl.
CPC .............. *G02B 19/0028* (2013.01); *F21V 5/04* (2013.01); *F21Y 2101/02* (2013.01); *G02B 27/0983* (2013.01); *G02B 27/0994* (2013.01); *G02B 19/0061* (2013.01); *F21V 7/041* (2013.01); *F21V 13/04* (2013.01)
USPC ...... 362/297; 362/300; 362/311.07; 362/304; 362/296.08; 362/311.02

(58) Field of Classification Search
CPC ...... G02B 17/006; G02B 27/095; F21V 5/04; F21V 5/043
USPC ........ 362/308, 235, 249.02, 311.02, 329, 800
See application file for complete search history.

(56) References Cited

U.S. PATENT DOCUMENTS

| | | | | | |
|---|---|---|---|---|---|
| 4,622,486 | A | * | 11/1986 | Endo ............................. | 313/115 |
| 5,103,381 | A | * | 4/1992 | Uke .............................. | 362/560 |
| 6,177,761 | B1 | * | 1/2001 | Pelka et al. .................... | 313/512 |
| 7,275,841 | B2 | * | 10/2007 | Kelly ........................... | 362/345 |
| 8,029,167 | B2 | * | 10/2011 | Ikeda et al. ................... | 362/327 |
| 8,303,141 | B2 | * | 11/2012 | Jiang ............................ | 362/338 |
| 2004/0264185 | A1 | * | 12/2004 | Grotsch et al. ............... | 362/231 |
| 2007/0064202 | A1 | * | 3/2007 | Moffat et al. .................. | 353/94 |
| 2007/0109775 | A1 | * | 5/2007 | Chen ............................ | 362/187 |

FOREIGN PATENT DOCUMENTS

JP    2007-235079    9/2007

* cited by examiner

*Primary Examiner* — Diane Lee
*Assistant Examiner* — Kenny C Sokolowski
(74) *Attorney, Agent, or Firm* — Lucas & Mercanti, LLP

(57) ABSTRACT

A light emitting device comprises: a surface light source for a surface-emission; a CPC lens having a light receiving surface, a side reflective surface, and a light emitting surface, the light receiving surface receiving a part of light from the surface light source, the side reflective surface reflecting the light from the light receiving surface, and the light emitting surface facing the light receiving surface and emitting the light; and a reflector containing the surface light source and the CPC lens, and having a concaved reflective surface for reflecting forward the light deviating the light receiving surface from the surface light source, wherein a ratio of a illumination area of the surface light source to an area of the light receiving surface of the CPC lens is not less than 0.63 and not more than 2.93.

4 Claims, 6 Drawing Sheets

LIGHT EMITTING DEVICE

This application claims priority of Japanese Application JP2011-038824 filed Feb. 24, 2011, the contents of the Japanese application are incorporated herein by reference.

BACKGROUND OF THE INVENTION

1. Field of the Invention

This invention relates to an alternative light emitting device, which gives no feeling of strangeness for users, to a conventional halogen lamp. The light emitting device comprises: a surface light source; a lens provided in front of the surface light source and receiving light from the surface light source; and a reflector accommodating the surface light source and the lens, and reflecting the light diverging from the lends. And a relation between a light emitting area of the surface light source and a light receiving area of the lens is properly designed.

2. Description of the Related Art

A light-emitting diode "LED", which has good points such as low power consumption and long life as against a conventional halogen lamp, is widely used, because people become more ecology conscious. And people consider that using the LED is one policy for the energy-saving strategies. Particularly, it is highly required to use the LED as an alternate item of the halogen lamp or the like.

But there is a problem that the light from the LED provides a feeling of strangeness for users accustomed to the conventional halogen lamps. In general, the light from a LED has a directional pattern, a lambertian pattern. Using the LED as a replacement for the halogen lamp causes a large difference in intensity between a strong light illuminating the center and near the center of illumination and a weak light illuminating a circumference of them. "The center of illumination" is an intersection point of an illuminated surface and a light axis of the light emitting device.

One method for reducing the feeling of strangeness has been studied. The method uses a surface light source, an electro-luminescence or the like to enlarging the area illuminated by the strong light. The surface light source has a lot of LED elements arranged a base plate. Furthermore, a light emitting device increasing a uniformity of the strong light by increasing a light condensing efficiency has been developed (e.g., Patent document 1: Japanese Laid-Open Patent Publication No. 2007-235079). The light emitting device has a CPC (Compound Parabolic Concentrators) lens combined with the surface light source.

As shown in FIG. 3, the CPC lens 1 is a bullet-shaped cylinder having a side reflective surface 2 determined by a trajectory made by rotating a pair of parabolas A, B around a rotating center CL. The parabolas A, B are axisymmetrically-arranged by the rotating center CL, and each focal point of the parabolas A, B has different position each other. Furthermore, the CPC lens has a light receiving surface 3 and a light emitting surface 4, which are in a direction perpendicular to the rotating center CL. In the Patent document 1, the cylindrical CPC lens 1 is disclosed. A solid transparent cylinder having the same shaped side reflective surface 2 performs the same function. Light entering this CPC lens 1 through the light receiving surface 3 is emitted from the light emitting surface 4 in the range of an aperture angle θ centering the rotating center CL. The rotating center CL is a light axis of the CPC lens 1.

The uniformity of the light illuminating the illuminated surface is increased by using such a CPC lens, because the light entering into the CPC lens 1 through the light receiving surface 3 is emitted from the light emitting surface 4 within an aperture angle θ. The light emitting device further reduces the feeling of strangeness of the users than a case using the surface light source alone.

SUMMARY OF THE INVENTION

The larger a light-emitting area of the surface light source is, the larger an area of the light receiving surface 3 receiving the light from the surface light source is. Enlargement of the area of the light receiving surface 3 causes an increase in weight of the CPC lens 1 and material cost. And the above enlargement also causes an increase in weight of the light emitting device, with an increase of weight load for equipment that the light emitting device is fixed to.

A bowl-shaped reflector having a reflective surface inside, which reflects the light missing the light receiving surface 3, can be combined instead of the enlargement in area of the light receiving surface 3. But, in this case, merely reflecting the light missing the light receiving surface 3 forward also causes the feeling of strangeness of the users accustomed to the conventional halogen lamp.

As shown in FIG. 6, the "light from CPC lens" which enters through the light receiving surface 3 and emits from the CPC lens 1 illuminates the illuminated surface. An illumination distribution "A" of the illuminated surface exhibits high uniformity as described above; the shape of the illumination distribution is in trapezoid. Meanwhile, an illumination distribution "B" of the "light reflected by a reflector" which misses the light receiving surface 3 and be reflected forward by the reflector is a narrower width rectangular than the illumination distribution "A."

An illumination distribution "C" of the light from a halogen lamp is a parabolic distribution having a vertex on the light axis CL as illustrated by broken lines.

In case that the amount of the light from CPC lens is too larger than the amount of the light reflected by the reflector, the illumination distribution "A" becomes highly visible. Then the shape of the illumination distribution of the light emitting device becomes a trapezoid. On the other hand, in case that the amount of the light from CPC lens is too less than the amount of the light reflected by reflector, the illumination distribution "B" becomes highly visible. Then the shape of the illumination distribution of the light emitting device becomes a narrower width rectangular. In both cases, a difference in shape between the illumination distribution of the light emitting device and the illumination distribution "C" for the light from a halogen lamp becomes larger. These both cases cause the feeling of strangeness of the users accustomed to the conventional halogen lamps.

In short, for avoiding the feeling of strangeness of the users, balancing the amount of the light from CPC lens and the amount of the light reflected by reflector is the most important point for making an integrated illumination distribution "A" and "B" similar to the illumination distribution "C" of the light from a halogen lamp.

The present invention has been made to clear the above issues associated with the conventional arts. It is, therefore, a main object of the present invention to provide a light emitting device of which the amount of the light from CPC lens and the amount of the light reflected by reflector are balanced properly. The light emitting device can avoid the feeling of strangeness of the users accustomed to the conventional halogen lamps having a reflector.

In accordance with a first aspect of the present invention, a light emitting device 10 comprises: a surface light source 12 for a surface-emission; a CPC lens 14 having a light receiving surface 22, a side reflective surface 24, and a light emitting surface 26, the light receiving surface 22 receiving a part of light from the surface light source 12, the side reflective surface 24 reflecting the light from the light receiving surface 22, and the light emitting surface 26 facing the light receiving surface 22 and emitting the light; and a reflector 16 containing the surface light source 12 and the CPC lens 14, and having a concaved reflective surface 30 for reflecting forward the light deviating the light receiving surface 22 from the surface light source 12, wherein a ratio of a illumination area of the surface light source 12 to an area of the light receiving surface 22 of the CPC lens 14 is not less than 0.63 and not more than 2.93.

As described above, balancing the amount of the light from CPC lens and the amount of the light reflected by the reflector is the most important. After trials of a variety of ratios, the inventors have found that designing the ratio of the illumination area S2 of the surface light source 12 to the area S1 of the light receiving surface 22 of the CPC lens 14 for not less than 0.63 and not more than 2.93, i.e. 0.63≤S2/S1≤2.93, makes the integrated illumination distribution "A" and "B" similar to the illumination distribution "C" of the light from a halogen lamp. This causes the avoidance of the feeling of strangeness of the users accustomed to the conventional halogen lamps.

A distance between a light emitting surface 12a of the surface light source 12 and the light receiving surface 22 of the CPC lens 14 may be not less than 0.5 mm and not more than 4.0 mm.

Setting the distance between the light emitting surface 12a of the surface light source 12 and the light receiving surface 22 of the CPC lens 14 for not less than 0.5 mm and not more than 4.0 mm makes the integrated illumination distribution "A" and "B" similar to the illumination distribution "C" of the light from a halogen lamp. This makes a possibility of the avoidance of the feeling of strangeness of the users accustomed to the conventional halogen lamps higher.

According to the present invention, the light emitting device which can balance the amount of the light from CPC lens and the amount of the light reflected by reflector properly and avoid the feeling of strangeness of the users accustomed to the conventional halogen lamps having a reflector can be provided.

DETAILED DESCRIPTION OF THE INVENTION

Figure 1:
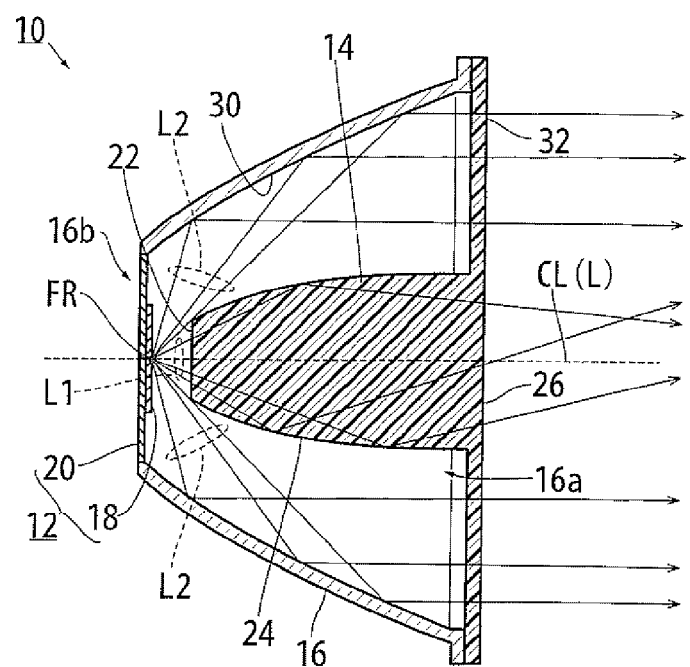
FIG. 1 is a sectional view showing a light emitting device in accordance with an embodiment of the present invention.
Figure 2:
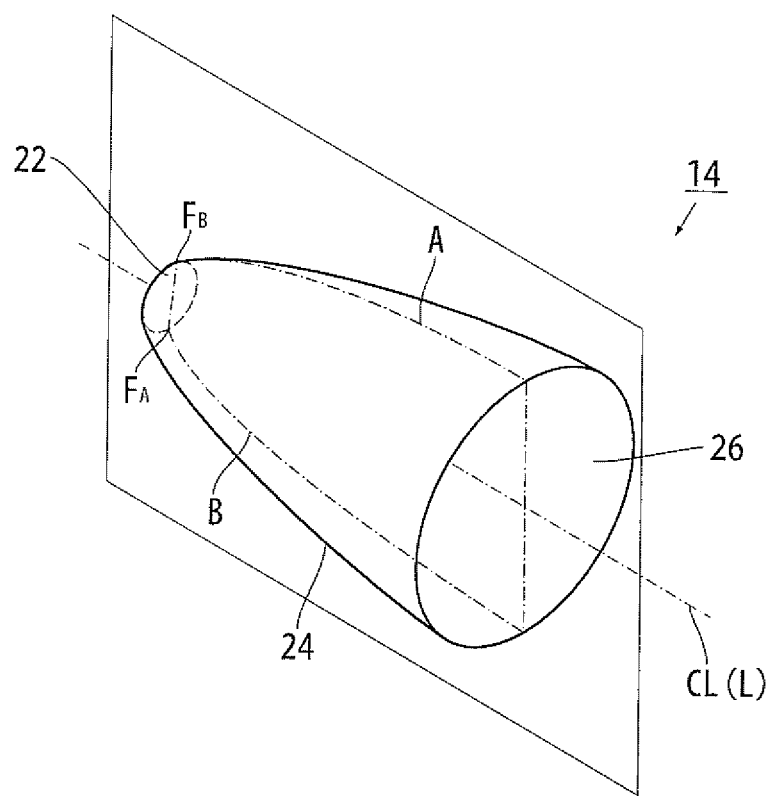
FIG. 2 is a perspective view showing a CPC lens.

Some embodiments according to the present invention are explained with figures as below. FIG. 1 is a sectional view showing a light emitting device 10 of the present invention, and FIG. 2 is a perspective view showing a CPC lens 14 of the light emitting device 10. The light emitting device 10 of the present invention comprises a surface light source 12, a CPC lens 14, and a reflector 16.

The surface light source 12 comprises: a light emitting part 18; and a light emitting part holder 20 holding the light emitting part 18 and being printed a feed circuit (not shown) for supplying electric power to the light emitting part 18. A surface-emitting light source, e.g. a lamp having a lot of LED elements arranged on the light emitting part holder 20, or an Electro-Luminescence, is used as the light emitting part 18. In addition, the surface-emitting light source is not limited to the LED or the Electro-Luminescence. Other types of light source can be used; any color of the light can be used.

The CPC lens 14 is a solid-transparent body and made of polycarbonate, quartz glass, or the like. And the CPC lens 14 comprises: a light receiving surface 22, a side reflective surface 24, and a light emitting surface 26. The light receiving surface 22 is round in shape and receives the light from the surface light source 12. The side reflective surface 24 reflects the light passing through the light receiving surface 22 and moving within the CPC lens 14. The circular light emitting surface 26 is orthogonally-crossed to the center axis CL of the light receiving surface 22 and faces the surface 22. And the light emitting surface 26 emits the light reflected by the side reflective surface 24 or the light directly from the light receiving surface 22, i.e. the light not reflected by the side reflective surface 24. The center axis CL of the CPC lens 14 coincides with a light axis L of the surface light source 12. And the light receiving surface 22 of the CPC lens 14 is separately-placed from a light emitting surface 12a of the surface light source 12.

Figure 3:
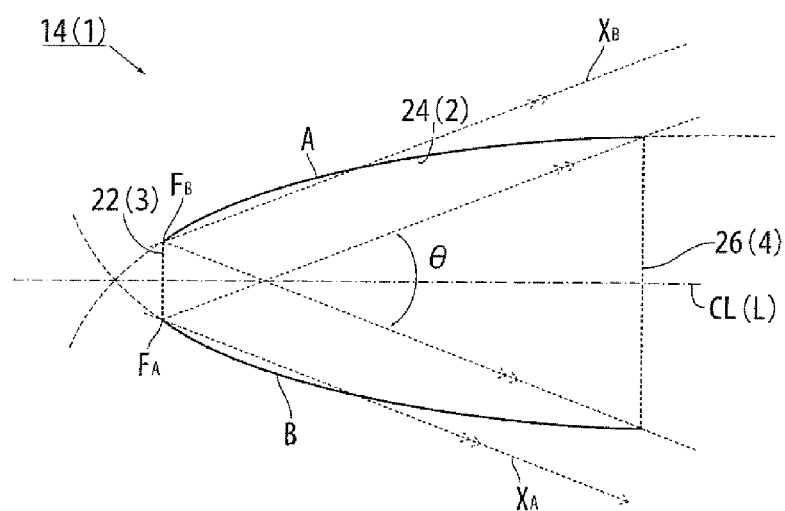
FIG. 3 shows a side reflective surface of the CPC lens.

The side reflective surface 24 is a surface of revolution determined by revolving around the center axis CL. As shown in FIG. 3, the surface of revolution is determined by revolving a pair of parabolas A, B with a central focus on the center axis CL. Each parabola A, B has a focal point $F_A$, $F_B$. The focal point FA of one parabola A is on the other parabola B; and the focal point $F_B$ of the other parabola B is on the one parabola A. Furthermore, an axis $X_A$ of the one parabola A passes through the focal point $F_A$ of one parabola A; an axis $X_B$ of the other parabola B passes through the focal point $F_B$ of the other parabola B. An angle θ formed by the axes $X_A$, $X_B$ is an aperture angle of the CPC lens 14.

An outer side surface of the side reflective surface 24 of the CPC lens 14 may be covered with a total reflection coat (not shown). This prevents the light, which enters through the light receiving surface 22, from passing through the side reflective surface 24 and going outside of the CPC lens 14.

Figure 4:
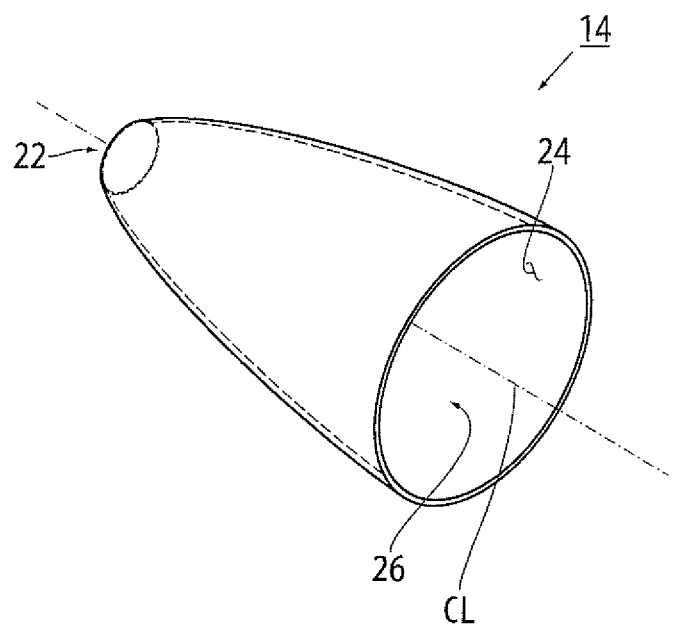
FIG. 4 is a perspective view showing another embodiment of the CPC lens.

Furthermore, the CPC lens 14 may not be a solid-transparent body, but a cylinder, as shown in FIG. 4. When the CPC lens 14 is a cylinder, one opening being near the surface light source 12 is the light receiving surface 22; the other opening being far from the light receiving surface 22 is the light emitting surface 26.

The reflector 16, as shown in FIG. 1, is a bowl-shaped member having inside a concaved reflective surface 30 for reflecting the light diverging from the light receiving surface 22 of the CPC lens 14. The light forms a large angle with the center axis CL. The reflector 16 can be formed with glass, aluminum, plastics or the like. When the reflector 16 is formed with aluminum, the concaved reflective surface 30 is metallized or alumited. And when the reflector 16 is formed with glass, a multiple-layer reflection coating for visible light or metallic coatings can be used. A clear cover 32 covers an opening 16a of the reflector 16. A light emitting part holder 20 of the surface light source 12 covers a bottom opening 16b of the reflector 16. The surface light source 12 is retained at a position where the light axis L of the surface light source 12 and the center axis CL of the CPC lens 14 coincide each other.

The clear cover 32 is a board formed with polycarbonate, quartz glass, plastics or the like. In this embodiment, the clear cover 32 is integrated with the CPC lens 14 on an edge at the side of the light emitting surface 26.

Figure 5:
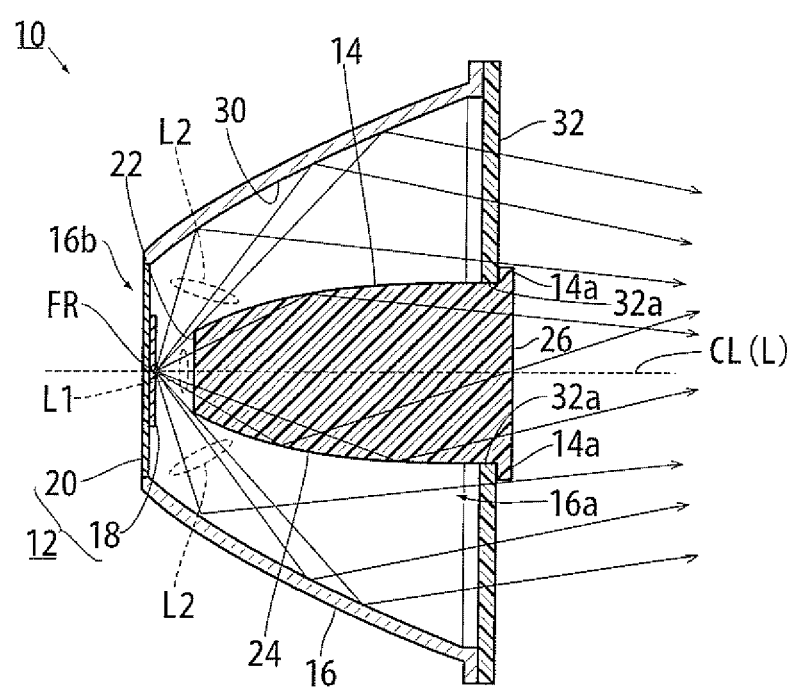
FIG. 5 is a sectional view showing another embodiment of the light emitting device.
Figure 6:
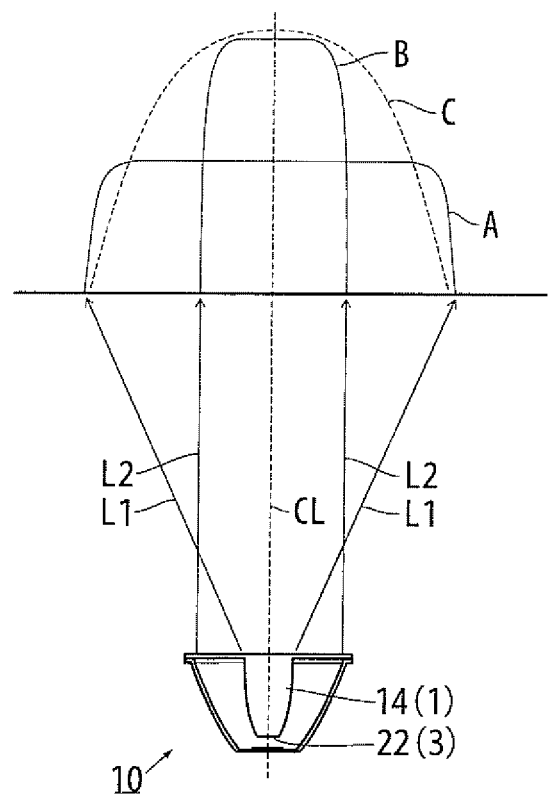
FIG. 6 shows illumination distribution of light from the CPC lens, light reflected by reflector, and light from a halogen lamp.

The clear cover 32 and the CPC lens 14 can be provided separately. For example, as shown in FIG. 5, a flange 14a is provided around the outer surface on an edge at the side of the light emitting surface 26. And a hole for CPC lens 32a having an outer diameter smaller than an outer diameter of the flange 14a and largish than an outer diameter of the CPC lens 14 is provided at the center of the clear cover 32. The clear cover 32 and the flange 14a are fixed by adhesives, after setting the CPC lens 14 into the hole 32a and setting the flange 14a onto the clear cover 32.

The concaved reflective surface 30 provided inside the reflector 16 is a paraboloidal surface of revolution with the center axis CL at the center. In this embodiment, the focal point FR of the paraboloidal surface of revolution is set at the center of the light emitting part 18 of the surface light source 12. The shape of the concaved reflective surface 30 is not limited to the paraboloidal surface of revolution. The shape may be an elliptical surface of revolution. And the focal point FR of the paraboloidal surface of revolution does not always have to be set at the center of the light emitting part 18. But setting the focal point FR at the center of the light emitting part 18 is preferred. When the shape of the concaved reflective surface 30 is the paraboloidal surface of revolution, the light reflected on the concaved reflective surface 30 is almost parallel to the center axis CL, as shown in FIG. 1. On the other hand, when the shape of the concaved reflective surface 30 is the elliptical surface of revolution, the light reflected on the reflective surface 30 converges to the concentration point (not shown) on the center axis CL outside the reflector 16. By setting the focal point FR at the center of the light emitting part 18, the light reflected on the reflective surface 30 gets regularity. Therefore, it becomes easy to get a required illumination distribution. When the shape of the concaved reflective surface 30 is the elliptical surface of revolution, it is preferred to set the second focal point, the concentration point, away from the reflector 16 so that the reflected light does not illuminate the CPC lens 14. In other words, the "almost paraboloidal" elliptical surface is preferred. In case that the second focal point is set near the light emitting device 10, the light reflected on the reflector 16 illuminates an outer surface of the side reflective surface 24 of the CPC lens 14. Then the light reflected to an unintended direction becomes a glare, a stray light. The shape of the concaved reflective surface 30 is not limited to the paraboloidal surface of revolution or the elliptical surface of revolution. All concave surface can be used as the concaved reflective surface 30.

By supplying an electric power to the light emitting part 18 of the surface light source 12 of the light emitting device 10 through a power circuit (not shown) printed on the light emitting part holder 20, the surface light source 12 emits the light. And a part L1 of the light heads for the light receiving surface 22 of the CPC lens 14; the other part of the light deviating from the light receiving surface 22 heads for the concaved reflective surface 30 of the reflector 16.

The light L1 toward the light receiving surface 22 of the CPC lens 14 passes through the light receiving surface 22 and enters the CPC lens 14 before the light L1 is reflected on the side reflective surface 24. Then the light L1 is emitted from the light emitting surface 26 within a predetermined angle θ. A part of the light L1 is emitted directly from the light emitting surface 26 without reflection on the side reflective surface 24. Hereinafter the light L1 is called "the CPC lens light L1."

On the other hand, the light L2, which is deviated from the light receiving surface 22 of the CPC lens 14, toward the concaved reflective surface 30 of the reflector 16 is reflected on the concaved reflective surface 30 before the light L2 is emitted from the clear cover 32. When the concaved reflective surface 30 is the paraboloidal surface of revolution, the light L2 is emitted as a parallel light, as shown in FIG. 1. When the concaved reflective surface 30 is the elliptical surface of revolution, the light L2 is emitted as a converging light, as shown in FIG. 5. Hereinafter, the parallel or converging light is called "the reflected light L2."

The "parallel" light is not limited to the "perfectly-parallel" light; the "parallel" light includes a "non-parallel" light which does not provide a feeling of strangeness to users. Similarly, the "converging" light is not limited to the "perfectly-convergent" light; the "converging" light means the light which converges on a certain area. The reason is that it is impossible to emit whole light of the surface light source 12 from the focal point FR of the paraboloidal or elliptical surface of revolution.

If an amount of the CPC lens light L1 is too larger than an amount of the reflected light L2, the illumination distribution "A" becomes highly visible and the illumination distribution of the light emitting device becomes a trapezoid in shape. In contrast, if the amount of the CPC lens light L1 is too smaller than the amount of the reflected light L2, the illumination distribution "B" becomes highly visible and the illumination distribution of the light emitting device becomes a narrow rectangular in shape. Because the illumination distributions of both cases differ from the illumination distribution "C" of the light from a halogen lamp, both of the illumination distributions provide a feeling of strangeness to users.

Not to provide a feeling of strangeness to users, it is the most important to balance the amount of the CPC lens light L1 and the amount of the reflected light L2 and to make an illumination distribution, which is a compound of the illumination distribution "A" and "B," similar to the illumination distribution "C" of the light from a halogen lamp. Therefore, area S1 [mm2] of the light receiving surface 22 of the CPC lens 14 and illumination area S2 [mm2] of the surface light source 12 are set as parameter; the numerical value of the illumination area S2 per the area S1 is set as variable number. Table 1 shows whether the illumination distribution of the light emitting devices (embodiments 1-8 and comparative examples 1-2) having different "S2/S1 value" provide a feeling of strangeness to users accustomed to the conventional halogen lamps.

TABLE 1

|  | Area S1 of the light receiving surface [mm$^2$] | Illumination area S2 of the surface light source [mm$^2$] | S2/S1 | Distance from illumination area to light receiving surface [mm] | Evaluation |
| --- | --- | --- | --- | --- | --- |
| Embodiment 1 | 34.2 | 100.3 | 2.93 | 1.6 | Good |
| Embodiment 2 | 34.2 | 100.3 | 2.93 | 1.3 | Good |
| Embodiment 3 | 56.7 | 100.3 | 1.77 | 3.3 | Good |
| Embodiment 4 | 34.2 | 50.4 | 1.47 | 1.6 | Good |
| Embodiment 5 | 34.2 | 50.4 | 1.47 | 1.3 | Good |
| Embodiment 6 | 56.7 | 50.4 | 0.89 | 3.3 | Good |
| Embodiment 7 | 28.3 | 56.8 | 2.01 | 0.7 | Good |
| Embodiment 8 | 56.7 | 36.0 | 0.63 | 3.3 | Good |
| Comparative Example 1 | 56.7 | 20.4 | 0.36 | 4.5 | Poor |
| Comparative Example 2 | 28.3 | 100.3 | 3.54 | 0.4 | Poor |

Table 1 shows that setting the value obtained by dividing the "illumination area of the surface light source S2" by the "area of the light receiving surface S1" for not less than 0.63 and not more than 2.93 (0.63≤S2/S1≤2.93) makes the compound illumination distribution similar to the illumination distribution "C" of the light from a halogen lamp. The light having the compound illumination distribution is difficult to provide a feeling of strangeness to users accustomed to the conventional halogen lamps.

Furthermore, a distance from the light emitting surface 12a of the surface light source 12 to the light receiving surface 22 of the CPC lens 14 is set for not less than 0.5 mm and not more than 4.0 mm, and preferably not less than 0.7 mm and not more than 3.3 mm, with reduction of possibility of the feeling of strangeness of the users.

In the aforementioned embodiment, the light receiving surface 22 is smoothed; many fine concavities and convexities may be provided for the surface. For example, a frosted-glass surface by blast treatment can be adopted. When the non-smooth surface is adopted, the light from the surface light source 12 toward the light receiving surface 22 is diffused by the many fine concavities and convexities. Then more uniform light is emitted to the inside of the CPC lens 14 as if the light receiving surface 22 emits light having large aperture angle. That results in an improvement of the light uniformity of the CPC light L1 for the lighting area.

Furthermore, the light emitting device 10 is constituted of one surface light source 12 and one CPC lens 14; the light emitting device 10 may be constituted of multiple surface light sources 12 and a corresponding number of CPC lenses 14. The light from the multiple surface light sources 12 is emitted in a mass. The light emitting device 10, therefore, becomes small and high power emitting a large amount of light.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

The disclosure of Japanese Patent Application No. 2011-38824 filed Feb. 24, 2011 including specification, drawings and claims is incorporated herein by reference in its entirety.

What is claimed is:

1. A light emitting device comprising:
  a surface light source having a first light emitting surface, the surface light source comprising a plurality of light emitting diode elements adapted to emit light;
  a CPC lens having a light receiving surface, a side reflective surface, and a second light emitting surface, the light receiving surface spaced a distance from the surface light source, the light receiving surface receiving a first part of the light from the plurality of light emitting diode elements, the side reflective surface reflecting a portion of the first part of the light received by the light receiving surface, and the second light emitting surface facing the light receiving surface and forwardly emitting the first part of the light; and
  a reflector containing the surface light source and the CPC lens, and having a concave reflective surface for reflecting forward a second part of the light which is not received by the light receiving surface from the plurality of light emitting diode elements,
  wherein a ratio of an illumination area (mm$^2$) of the surface light source to an area (mm$^2$) of the light receiving surface of the CPC lens is not less than 0.63 and not more than 2.93, the distance between the first light emitting surface of the surface light source and the light receiving surface of the CPC lens is between 0.5 mm and 4.0 mm,
  the light emitting device further comprising:
    an annular opening between the light emitting surface of the CPC lens and the concave reflector surface, and
    an annular clear cover covering the annular opening;
      wherein the CPC lens has a center axis; and
  the side reflective surface of the CPC lens is a surface of revolution determined by revolving first and second parabolas with a central focus on the center axis of the CPC lens, wherein:
  a first focal point of the first parabola is located on the second parabola;
  a second focal point of the second parabola is located on the first parabola;
  a first axis of the first parabola passes through the first focal point;
  a second axis of the second parabola passes through the second focal point;
  and an angle formed by the first axis and the second axis defines an aperture angle of the CPC lens.

2. The light emitting device according to claim 1, wherein:
  the concave reflective surface of the reflector is a paraboloidal surface of revolution with the center axis of the CPC lens near or at the center of the surface light source; and
  the focal point of the paraboloidal surface of revolution is set near or at the center of the first light emitting part surface of the surface light source.

3. The light emitting device according to claim 1, wherein the light receiving surface comprises a frosted glass material formed by blast treatment.

4. The light emitting device according to claim 1, wherein:
  the concave reflective surface of the reflector comprises an elliptical surface of revolution.

* * * * *